United States Patent [19]
Park et al.

[11] Patent Number: 6,051,492
[45] Date of Patent: Apr. 18, 2000

[54] METHOD OF MANUFACTURING A WIRING LAYER IN SEMICONDUCTOR DEVICE

[75] Inventors: Byung-lyul Park; Hyoung-sub Kim; Jung-min Ha, all of Seoul, Rep. of Korea

[73] Assignee: Samsung Electronics Co., Ltd., Rep. of Korea

[21] Appl. No.: 08/758,647

[22] Filed: Nov. 27, 1996

[30] Foreign Application Priority Data

Dec. 11, 1995 [KR] Rep. of Korea ................ 95-48327

[51] Int. Cl.⁷ .................. H01L 21/4763; H01L 21/461
[52] U.S. Cl. .................. 438/637; 438/627; 438/643; 438/648; 438/706; 408/707
[58] Field of Search .................. 438/637, 627, 438/643, 649, 710, 657, 706, 707, 728, 677, 687, 688, FOR 370

[56] References Cited

U.S. PATENT DOCUMENTS

| | | | |
|---|---|---|---|
| 5,052,339 | 10/1991 | Vakerlis et al. | 118/723 E |
| 5,487,923 | 1/1996 | Min et al. | 427/569 |
| 5,644,166 | 7/1997 | Honeycutt et al. | 257/754 |
| 5,821,620 | 10/1998 | Hong | 257/751 |

*Primary Examiner*—John F. Niebling
*Assistant Examiner*—Ha Tran Nguyen
*Attorney, Agent, or Firm*—Myers Bigel Sibley & Sajovec

[57] ABSTRACT

A method of manufacturing a metal wiring layer in a semiconductor device, wherein an insulating layer is plasma treated before a tungsten nitride film is formed on the insulating layer. A metal, metal silicide or metal alloy thereafter being deposited over the tungsten nitride film.

14 Claims, 2 Drawing Sheets

METHOD OF MANUFACTURING A WIRING LAYER IN SEMICONDUCTOR DEVICE

BACKGROUND OF THE INVENTION

The present invention relates to a method for manufacturing a semiconductor device. More particularly, the present invention relates to a method for manufacturing a semiconductor device using a tungsten nitride thin film.

The reliability and efficient formation of metal wiring and other metal structures within a semiconductor device largely determine the speed with which the device will operate, the manufacturing yield for the device, and its overall reliability. Accordingly, the method by which metal wiring and other metal structure are formed in a semiconductor device is among the most critical within the sequence of methods used to manufacture the device.

In early semiconductor devices having a relatively lower integration density, step coverage for a metal wiring layer did not pose much of a problem. Typically, aluminum (Al) has been used to form metal wiring layers. However, continuing increases in the integration of semiconductor devices have resulted in the necessity of forming contact holes with much smaller diameters, down to half micron. This necessity has proved problematic, since conventional methods of forming the metal wiring using Al can not reliably form buried contact holes having a diameter less than 1 $\mu$m. Attempts to use conventional Al methods in the formation of sub-1 $\mu$m contact holes often results in the formation of voids which adversely affect the reliability of the semiconductor device.

One conventional method of forming contact holes suggests using an aluminum and 1% silicon compound in which Al is over-saturated with silicon. Formation of a metal wiring layer from this compound typically requires that a barrier metal layer be formed between the metal wiring layer and the silicon substrate or insulating layer in order to prevent the formation of Al spiking, Si residue, or Si nodule caused by a reaction between the metal wiring layer and the silicon substrate. FIG. 1 is a sectional view illustrating this method of forming a metal wiring in a semiconductor device.

In FIG. 1, an active region is defined by a selectively formed field insulating film 3 in a semiconductor substrate 2. After forming an impurity diffusion region 4 which becomes a source/drain region in the active region, an insulating layer 6 having a contact hole exposing a portion of the impurity diffusion region 4 is formed. A barrier metal layer of titanium (Ti) 8 and titanium nitride (TiN) 10 is formed on side and bottom surfaces of the contact hole using a sputtering method. An Al metal wiring layer 12, which buries the contact hole, is then formed over TiN layer 10 to complete the exemplary electrode structure.

In this conventional method of forming metal wiring, the barrier metal layer is formed by a sputtering technique. This being the case, step coverage for the barrier metal layer becomes increasingly inferior as the aspect ratio of the contact hole increases. As step coverage degrades, voids are formed which short circuit th e electrical connection between the metal wiring and the underlying impurity diffusion region. Reliability of the semiconductor device suffers accordingly.

In addition to the foregoing problem, the TiN film used in the conventional barrier metal layer has a columnar structure. As such, TiN is not particularly well suited to its purpose in the foregoing structure. In fact, a subsequent heat treatment step is typically performed to reinforcing a TiN film structure. This additional step adds manufacturing complexity and can result in adverse side effects.

SUMMARY OF THE INVENTION

The present invention provides a method of manufacturing a metal wiring layer or other metal structure within a semiconductor device with improved performance characteristics. In particular, the present invention forms an insulating layer having a contact hole over a semiconductor substrate. The insulating layer is plasma treated before a tungsten nitride film is deposited over the contact hole.

The tungsten nitride film is formed by low pressure chemical vapor deposition using $WF_6$, $NH_3$ and $H_2$ as a reacting gas. The tungsten nitride film is formed at a pressure in a range of from 0.01 to 1 Torr, and at a temperature in a range of from 200 to 700° C. using RF or ECR plasma A metal wiring layer is formed on the tungsten nitride film, and may be a pure metal, silicide, or alloy of Al, W, Mo, Co, Ti, Cu, and Pt.

BRIEF DESCRIPTION OF THE DRAWINGS

The advantages of the present invention will become more apparent upon consideration of a preferred embodiment with reference to the attached drawings in which:

FIG. 1 is a sectional view illustrating the formation of a metal wiring layer in a semiconductor device according to a conventional technology;

FIG. 2 is a sectional view of a reaction chamber for depositing a tungsten nitride thin film according to the present invention;

DETAILED DESCRIPTION OF THE INVENTION

Figure 3:
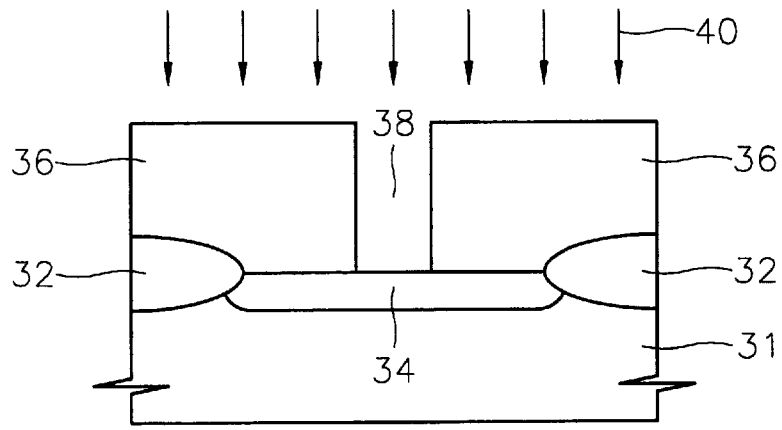
FIGS. 3 through 5 are sectional views illustrating a method of forming a metal wiring layer in a semiconductor device using a tungsten nitride thin film according to the present invention.

A tungsten nitride film is used as a barrier metal layer in the present invention. Hereinafter, a method for forming a tungsten nitride film is described with reference to attached drawings.

Figures 1, 2:
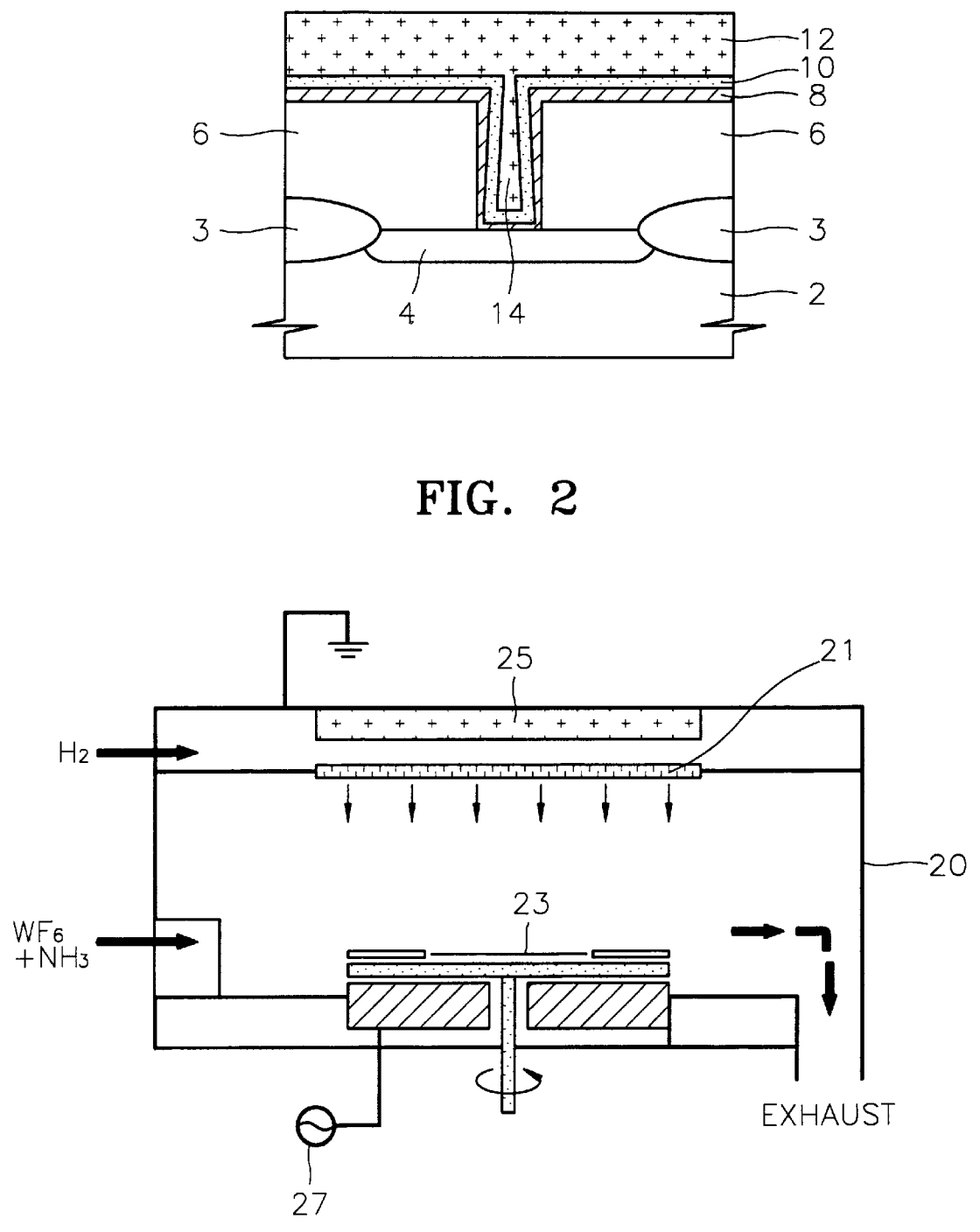

FIG. 2 is a sectional view of a low pressure chemical vapor deposition (LPCVD) reaction chamber for depositing a tungsten nitride film according to the present invention. Referring to FIG. 2, an IR (infrared) lamp 25 for heating a wafer 23 is attached near a shower-head 21 in reaction chamber 20. One or more reaction gases, such as $WF_6$ and/or $NH_3$, are passed horizontally, and a carrier gas, such as $H_2$ or Ar, is passed vertically through reaction chamber 20, and reacted with wafer 23 to form a tungsten nitride film. Wafer 23 may be rotated to improve the uniformity of the deposited tungsten nitride film. The reaction gases are preferably injected into reaction chamber 20 following the development of a vacuum below $10^{-6}$ Torr in order to minimize the influence of remaining materials in reaction chamber 20.

In the present invention, the tungsten nitride film is deposited in at a pressure in a range of from 0.01 to 1 Torr and at a temperature in a range of from 200 to 700° C. Preferably, the tungsten nitride film is deposited at a pressure of 0.1 Torr and a temperature of 600° C. The flow ratio of $NH_3/WF_6$ may be in a range of from 0.5 to 100, but is preferably 4. The flow ratio of $H_2/WF_6$ may be in a range of from 0 to 500, but is preferably 37.

According to the present invention, a plasma generating device 27 is included in reaction chamber 20. The use of a plasma field to treat the surface of wafer 23 prior to the deposition of the tungsten nitride film improves the performance characteristics of the resulting barrier field. The plasma treatment is performed at an power in the range of from 20 to 500 W, at a pressure in a range of from 0.01 to 1 Torr, and at a temperature in a range of from 200 to 700° C. Preferably, the plasma treatment is performed at a power 100 W, a pressure of 0.1 Torr, and a temperature of 600° C. The plasma treatment may be accomplished by using an RF (radio-frequency) plasma or an ECR (electron-cyclotron-resonance) plasma using a non-active gas such as Ar, $H_2$, $N_2$, and He.

Figure 4:
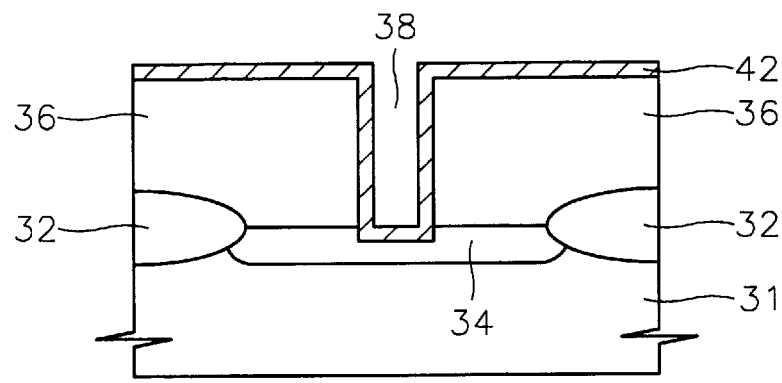
Figure 5:
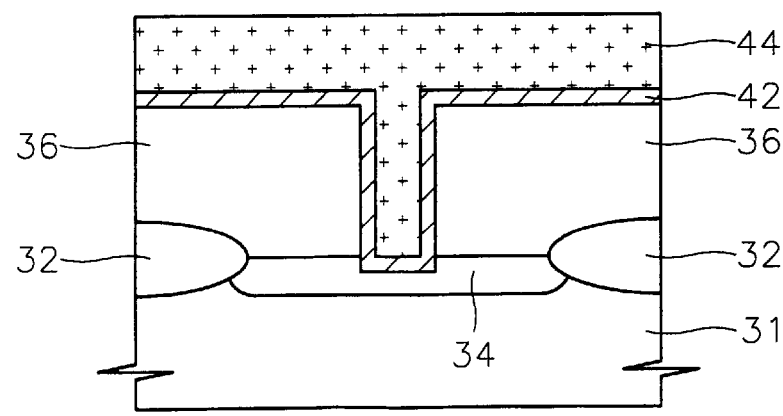

FIGS. 3 through 5 are sectional views illustrating a method of forming metal wiring for a semiconductor device using tungsten nitride according to the present invention. Referring to FIG. 3, an active region is defined by the selective formation a field insulating film 32 on a substrate 31. After formation of an impurity diffusion region 34 on a selected portion of the active region, an insulating film 36, for example, a silicon oxide film having a thickness of 500 to 2,000 Å is formed over silicon substrate 31. A contact hole 38 is formed by dry etching, for example, in insulating film 36 using a photolithography and etching process. Plasma treatment, indicated by arrows 40, is performed on the entire surface of resulting structure. An RF plasma or the ECR plasma using the non-active gas such as Ar, $H_2$, $N_2$, and He may be used.

In FIG. 4, a tungsten nitride film 42 is formed as a barrier layer over the surface of the contact hole. The tungsten nitride film 42 has a smooth surface due to the plasma treatment prior to deposition.

Referring to FIG. 5, the metal wiring of the semiconductor device is completed by the formation of a metal wiring layer 44 on the tungsten nitride thin film 42. At this time, it is preferable to use a pure metal such as Al, W, Mo, Co, Ti, Cu, and Pt, a silicide compound of these metals, or an alloy of the metals, as the material which constitutes the metal wiring layer 44. In the case where metal wiring layer 44 is tungsten, it is possible to continuously deposit this layer to a sufficient thickness in the same chamber.

Therefore, according to the present invention, it is possible to form a tungsten nitride film having a smooth surface and excellent step coverage on a plasma-treated semiconductor substrate. It is possible to prevent shorting of the metal wiring layer and to improve reliability of the semiconductor device by forming the metal wiring layer of tungsten nitride having these characteristics.

The foregoing embodiments are given by way of example. The present invention is not limited to the above embodiments and many variations are possible within the scope and spirit of the present invention as defined by the attached claims.

What is claimed is:

1. A method of manufacturing a semiconductor device, comprising the steps of:
   forming an insulating layer on a semiconductor substrate;
   forming a contact hole in the insulating layer to expose a portion of the semiconductor substrate;
   plasma treating the insulating layer with an RF or ECR plasma using a non-active gas;
   depositing a tungsten nitride film in at least the contact hole; and
   forming a metal wiring layer on the tungsten nitride film.

2. The method of claim 1, wherein the tungsten nitride film is formed by low pressure chemical vapor deposition.

3. The method of claim 1, wherein the tungsten nitride film is deposited using $WF_6$, $NH_3$ and $H_2$ as reacting gases.

4. The method of claim 1, wherein the tungsten nitride film is formed in a range of from 0.01 Torr to 1 Torr.

5. The method of claim 1, wherein the tungsten nitride film is formed in a range of from 200° C. to 700° C.

6. The method of claim 1, wherein the metal wiring layer comprises at least one metal selected from a group consisting of Al, W, Mo, Co, Ti, Cu and Pt.

7. The method of claim 1, wherein the metal layer comprises at least one metal silicide having a metal component selected from a group consisting of Al, W, Mo, Co, Ti, Cu, and Pt.

8. The method of claim 1, wherein the metal layer comprises at least one metal alloy including at least one metal selected from a group consisting of Al, W, Mo, Co, Ti, Cu, and Pt.

9. A method of manufacturing a semiconductor device, comprising the steps of:
   forming an insulating layer on a semiconductor substrate, the insulating layer including a contact hole therein;
   plasma treating the insulating layer including the contact hole with an RF or ECR plasma using a non-active gas;
   depositing a tungsten nitride film in at least the contact hole, after performing the step of plasma treating the insulating layer including the contact hole; and
   forming a metal wiring layer on the tungsten nitride film.

10. The method of claim 9, wherein the tungsten nitride film is formed by low pressure chemical vapor deposition.

11. The method of claim 9, wherein the tungsten nitride film is deposited using $WF_6$, $NH_3$ and $H_2$ as reacting gases.

12. The method of claim 9, wherein the metal wiring layer comprises at least one metal selected from a group consisting of Al, W, Mo, Co, Ti, Cu and Pt.

13. The method of claim 9, wherein the metal layer comprises at least one metal silicide having a metal component selected from a group consisting of Al, W, Mo, Co, Ti, Cu, and Pt.

14. The method of claim 9, wherein the metal layer comprises at least one metal alloy including at least one metal selected from a group consisting of Al, W, Mo, Co, Ti, Cu, and Pt.

* * * * *